(12) United States Patent
Hosomi et al.

(10) Patent No.: US 6,581,188 B1
(45) Date of Patent: Jun. 17, 2003

(54) SEMICONDUCTOR DEVICE AND METHOD OF DESIGNING THE SAME

(75) Inventors: Syunsuke Hosomi, Tokyo (JP); Makiko Saito, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/505,173

(22) Filed: Feb. 16, 2000

(30) Foreign Application Priority Data

Jul. 29, 1999 (JP) .......................................... 11-215062

(51) Int. Cl.[7] .............................................. G06F 17/50
(52) U.S. Cl. ....................... 716/2; 716/1; 716/8; 716/11
(58) Field of Search .............................. 716/1, 6, 8, 11, 716/2

(56) References Cited

U.S. PATENT DOCUMENTS 5,784,291 A * 7/1998 Chen et al. .................... 712/32
5,801,958 A * 9/1998 Dangelo et al. ............... 716/18
5,883,814 A * 3/1999 Luk et al. ....................... 716/2
5,970,240 A * 10/1999 Chen et al. .................... 703/25
6,125,431 A * 9/2000 Kobayashi ..................... 711/1

FOREIGN PATENT DOCUMENTS

| JP | 10334073 | * 10/1998 | ........... G06F/15/78 |
| JP | 10-302471 | 11/1998 | |

* cited by examiner

Primary Examiner—John F. Niebling
Assistant Examiner—Stacy A Whitmore
(74) Attorney, Agent, or Firm—Burns, Doane, Swecker & Mathis, LLP

(57) ABSTRACT

Data related to the configuration of a system are input in CAD (computer aided design) employed for designing the system. The CAD extracts data formable as a single chip from the said data. Thus, a semiconductor device and a method of designing the same reducing the burden imposed on a designer are obtained in relation to design of a system LSI.

7 Claims, 21 Drawing Sheets

F I G . 1 2
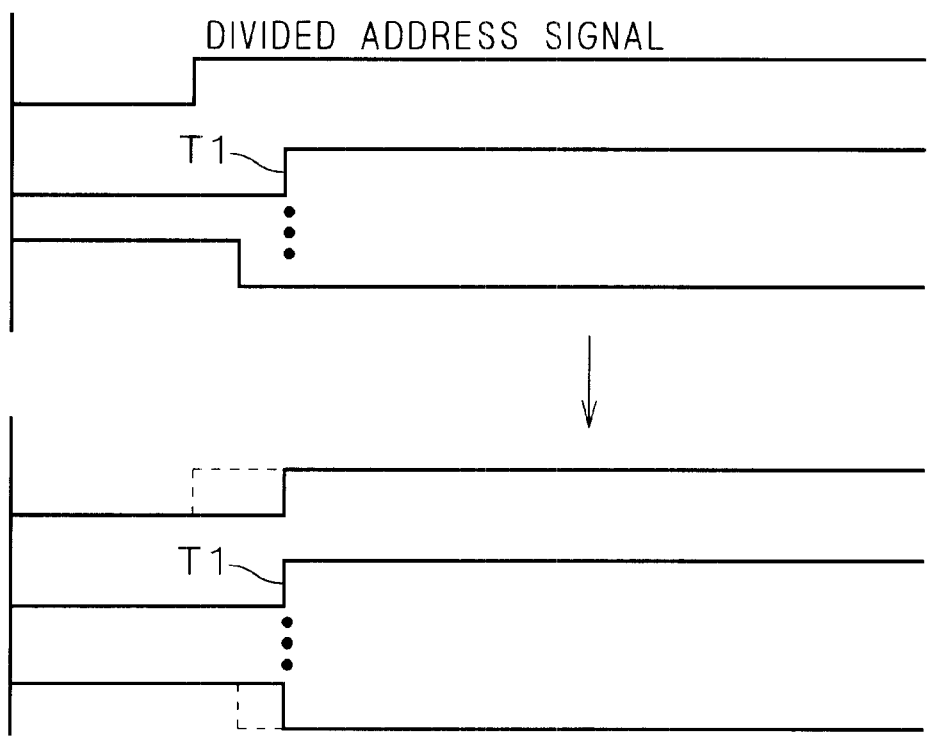

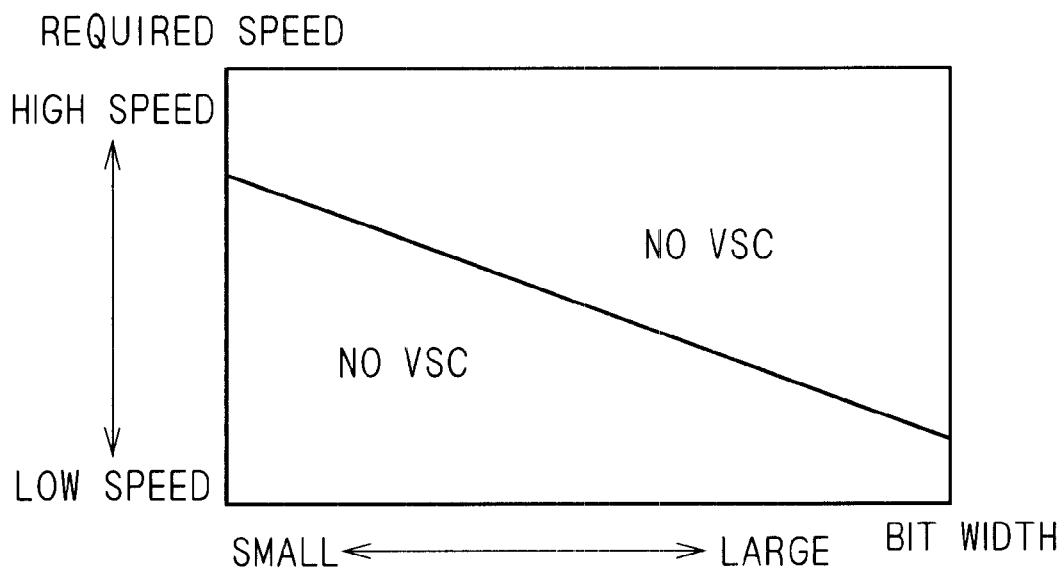
F I G . 14

CANDIDATE 1

F I G . 2 0
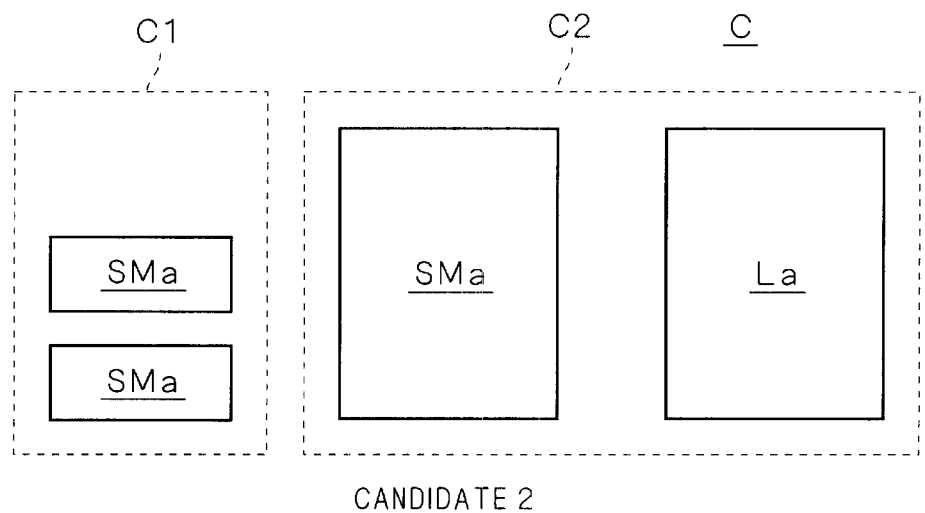
CANDIDATE 2
F I G . 2 1
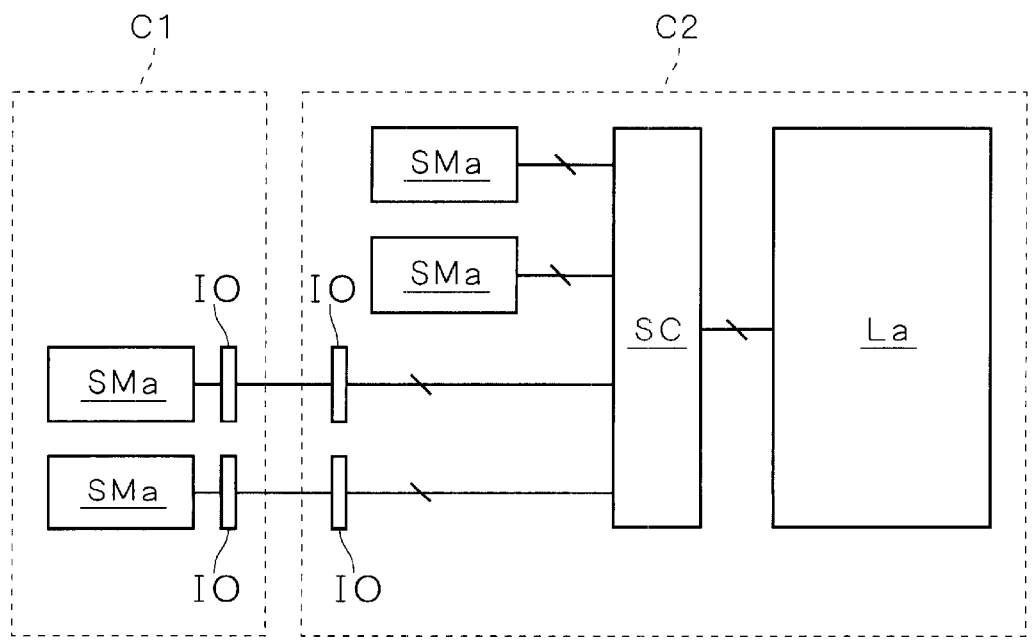

F I G. 2 5
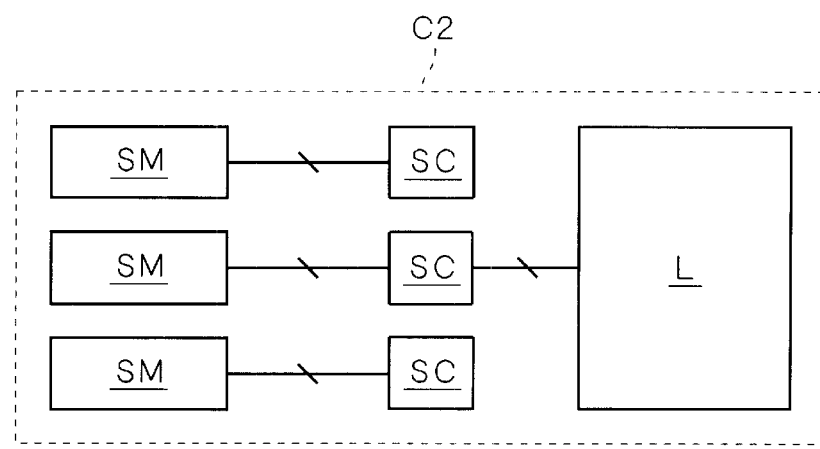
F I G. 2 6
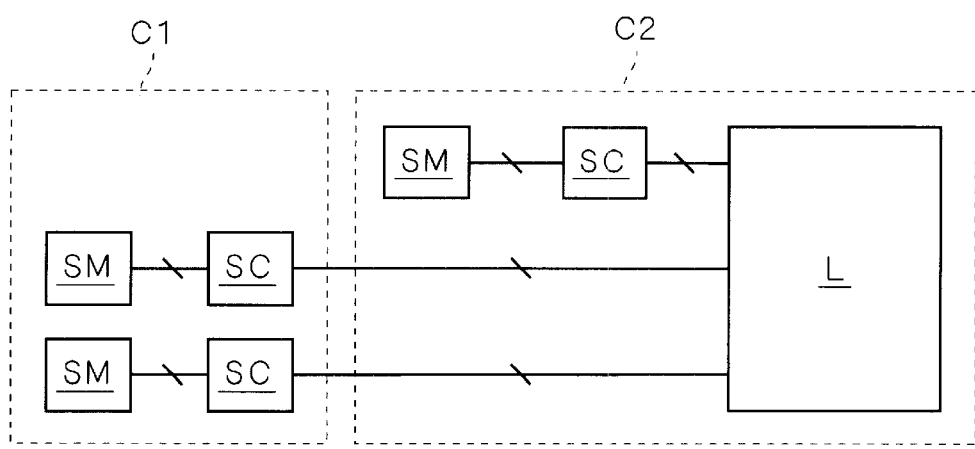

F I G . 29
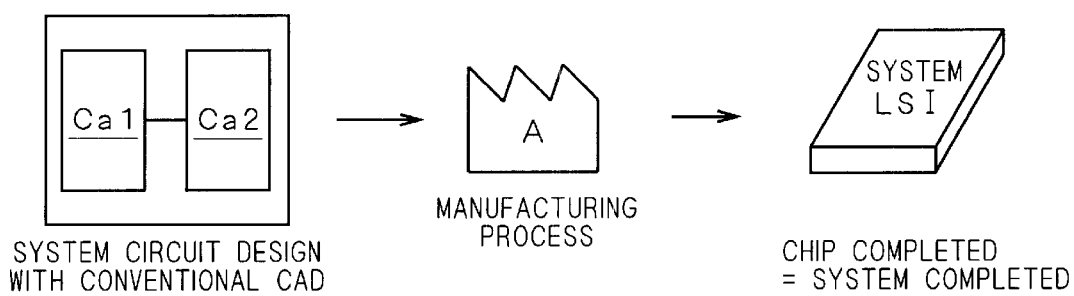

SEMICONDUCTOR DEVICE AND METHOD OF DESIGNING THE SAME

BACKGROUND OF THE INVENTION

1. Field of the Invention

The present invention relates to a method of designing a semiconductor device referred to as a system LSI, for example, and a semiconductor device obtained by this method.

2. Description of the Background Art

Refinement of semiconductor devices so progresses that it is said that all LSIs loaded on a mother board of a personal computer, for example, can be integrated into a single chip in the near future.

A device obtained by implementing control of a complicated application system is referred to as a system LSI. This can be regarded as a developed mode of ASIC (application specific IC). A portable telephone is mentionable as a current familiar example loaded with a system LSI. Some time ago the portable telephone was so large-sized and high-priced that only a few people possessed the same. However, the portable telephone has recently come into wide use due to miniaturization and cost reduction resulting from progress in refinement of the semiconductor device.

As hereinabove described, various advantages such as reduction of power consumption and improvement of the signal processing speed can be attained in addition to miniaturization of the system itself and cost reduction by integrating the largest possible number of components forming the system into a single chip.

It is said that not only the system itself but also the culture around the same remarkably changes in the coming age of such a system LSI. Design-manufacturing of the LSI is no exception.

In relation to design-manufacturing of the LSI, a system designer designs a system including a memory Ca1 and a logic circuit Ca2 (including a CPU, a control circuit controlling the memory Ca1 and the CPU etc.) in general, as shown in FIG. 28. Then, a circuit designer draws a circuit diagram Ca including the memory Ca1 and the logic circuit Ca2 with conventional CAD (computer aided design), and converts the circuit diagram to layout data Da1. Then, a system LSI is completed on the basis of the layout data Da1 through a manufacturing process A. Thus, the circuit diagram drawn by the circuit designer on the CAD forms the system as such. In other words, this is substantially equal to such a situation that the circuit designer designs the system, and it is predicted that design-manufacturing from design to completion of the system is extremely simplified as equivalently shown in FIG. 29.

As hereinabove described, a number of advantages can be attained not only for the LSI itself but for design-manufacturing around the same when integrating the largest possible number of circuits forming the system into a single chip.

However, it may be difficult to integrate all circuits forming a system into a single chip. In consideration of requirements (external factors) such as increase of the access speed to the memory, reduction of power consumption in the system, a bulk memory, the type of the memory etc., for example, the memory Ca1 may not be manufacturable through the manufacturing process A. In this case, a certain circuit designer draws the memory Ca1 with the conventional CAD and converts this circuit diagram to layout data Da2, for example. Then, a chip loaded with the memory Ca1 is completed on the basis of the layout data Da2 through a manufacturing process B. On the other hand, another circuit designer draws the logic circuit Ca2 with the conventional CAD and converts this circuit diagram to layout data Da3. Then, a chip loaded with the logic circuit Ca2 is completed on the basis of the layout data Da3 through the manufacturing process A. These two chips are loaded on a board, for finally completing a system satisfying the aforementioned requirements.

If a requirement R1 (external factor) for a multi-chip system (divided into a plurality of chips) rather than a single-chip system occurs in consideration of the cost in an intermediate stage of design with the CAD, for example, the circuit design must be performed again.

Although various advantages can be attained in a single-chip system as described above, the system must be designed in consideration of whether or not to integrate the circuits into a single chip in response to external factors in practice, disadvantageously leading to a heavy burden imposed on the designer.

SUMMARY OF THE INVENTION

According to a first aspect of the present invention, a semiconductor device comprises a logic circuit, a plurality of types of memories, and a memory control circuit interposed between the logic circuit and all of the plurality of types of memories for setting the response time of each of the plurality of types of memories as viewed from the logic circuit.

According to the first aspect, the memory control circuit sets the response time of each of the plurality of memories as viewed from the logic circuit, whereby the logic circuit can control the plurality of memories regardless of the types thereof.

According to a second aspect of the present invention, the memory control circuit includes a delay time set circuit for setting a delay, time for a control signal propagated from the logic circuit to each of the plurality of types of memories.

According to the second aspect, the delay time set circuit sets the delay time for the control signal, whereby the response time can be set.

According to a third aspect of the present invention, the memory control circuit includes a cache memory interposed between the logic circuit and the memories.

According to the third aspect, the response time can be set by providing the cache memory.

The present invention is also directed to a method of designing a semiconductor device. According to a fourth aspect of the present invention, a method of designing a semiconductor device comprises steps of (a) inputting data related to the configuration of a system in CAD (computer aided design) employed for designing the system, and (b) extracting data formable as a single chip from the data by the CAD.

According to the fourth aspect, a designer may not determine which one of system data input in the CAD is to be included in the single chip, whereby the burden imposed on the designer can be reduced.

According to a fifth aspect of the present invention, the system includes a memory and a logic circuit, and the step (b) includes a step (b-1) of extracting a memory impossible to design in a single chip with the logic circuit on the basis of data related to the configuration of the memory.

According to the fifth aspect, the semiconductor device is designed while taking out the memory from the chip on which the logic circuit is designed, whereby the space area of the chip on which the logic circuit is designed is increased to readily satisfy design conditions.

According to a sixth aspect of the present invention, a memory having a higher processing speed than a memory arranged with the logic circuit is extracted in the step (b-1).

According to the sixth aspect, the memory can be equally handled in point of the operating speed as viewed from the logic circuit, whereby the design is simplified.

According to a seventh aspect of the present invention, a memory control circuit for setting the response time of the memory as viewed from the logic circuit is arranged between the logic circuit and the memory.

According to the seventh aspect, the memory can be equally handled in point of the operating speed as viewed from the logic circuit, whereby the design is simplified.

According to an eighth aspect of the present invention, a memory having a power supply voltage different from that for the logic circuit is extracted in the step (b-1).

According to the eighth aspect, the CAD extracts a memory causing inconvenience when supplied with the same power supply voltage as that for the logic circuit, whereby the design is simplified.

According to a ninth aspect of the present invention, the step (a) includes a step (a-1) of displaying an image showing the data, and the step (b-1) includes a step (b-1-1) of making a display for rendering an image corresponding to data satisfying the single-chip condition conspicuous among the data of the memory in the image displayed through the step (a-1).

According to the ninth aspect, the range included in a single chip can be confirmed through the image among the data displayed on the CAD, whereby the design is simplified.

According to a tenth aspect of the present invention, a plurality of types of data related to the configurations of the logic circuit and the memory are registered in the CAD.

According to the tenth aspect, the circuit can be readily designed so that the memory as viewed from the logic circuit can be equally handled, whereby the burden imposed on the designer can be reduced.

An object of the present invention is to provide a semiconductor device and a method of designing the same reducing the burden imposed on a designer in relation to design of a system LSI.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is an operation explanatory diagram of an address speed conversion circuit in the first embodiment of the present invention;

FIG. 14 is a graph showing the relation between a required speed etc. and presence/absence of a storage circuit in the first embodiment of the present invention;

FIGS. 19 to 21 are block diagrams displayed on the CAD according to the second embodiment of the present invention;

FIGS. 25 to 27 are block diagrams input in CAD according to a third embodiment of the present invention;

FIG. 29 is a conceptual diagram equivalently showing the design-manufacturing process according to the conventional CAD.

DESCRIPTION OF THE PREFERRED EMBODIMENTS

Figure 1:
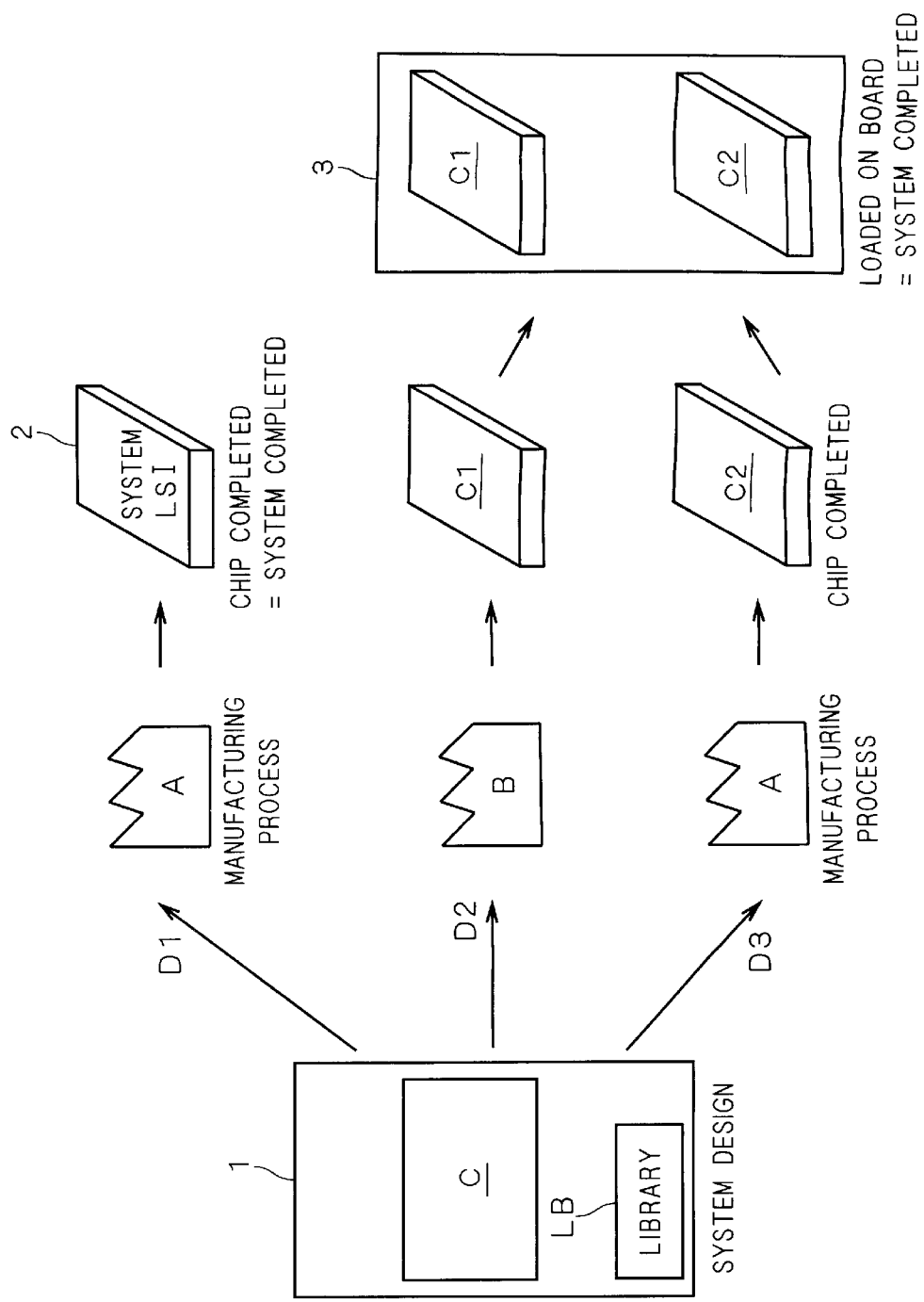
FIG. 1 is a conceptual diagram showing a design-manufacturing process in CAD according to the present invention.
Figure 28:
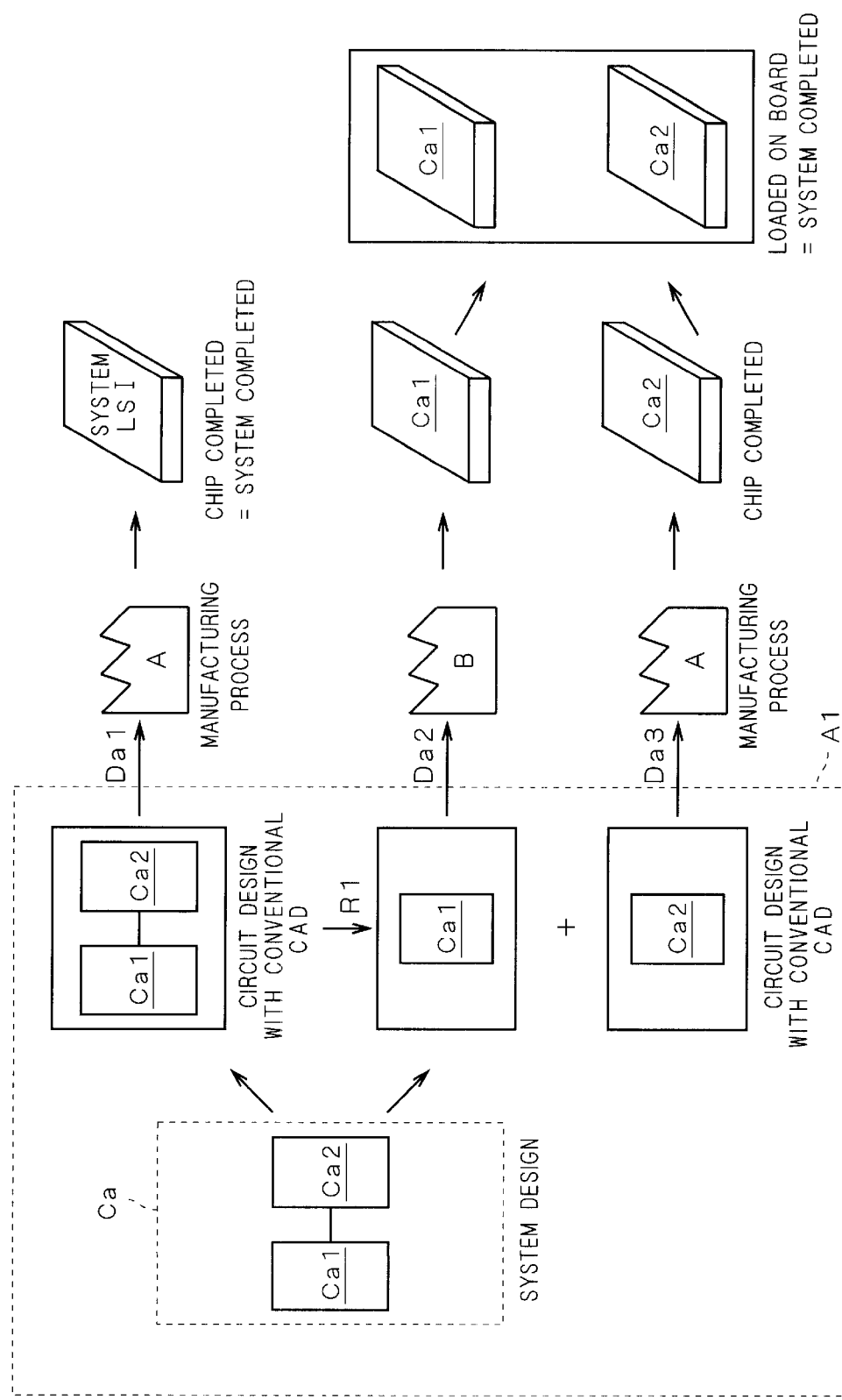
FIG. 28 is a conceptual diagram showing a design-manufacturing process according to conventional CAD.

FIG. 1 is a conceptual diagram showing a design-manufacturing process according to inventive CAD 1. The CAD 1 shown in FIG. 1 can be regarded as that summarizing the concept of a block A1 in FIG. 28. This CAD 1 determines whether or not a system can be implemented as a single chip in response to the external factors described with reference to the prior art and provides circuits (symbols) reducing a burden in circuit design. Thus, the burden imposed on a designer is reduced. The present invention is now described in detail.

First Embodiment

Figure 2:
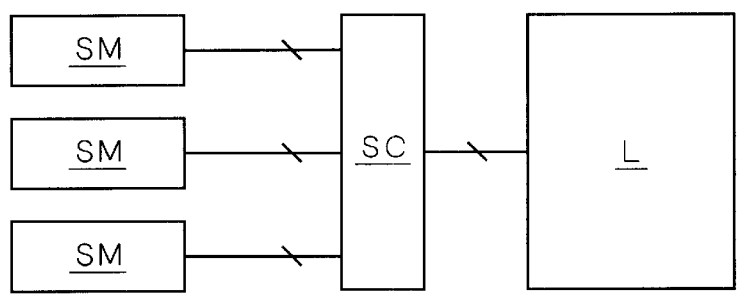
FIG. 2 is a block diagram showing an exemplary object of design according to a first embodiment of the present invention.

FIG. 2 shows the concept of the configuration of a system C to be designed in a first embodiment of the present invention. The system C shown in FIG. 2 includes memory symbols SM (scalable memory), a memory control circuit symbol SC (scalable control) and a logic circuit symbol L. Inclusive of the memory control circuit symbol SC, the memory symbols SM and the logic circuit symbol L, all symbols described below are registered in a library LB of the CAD 1 similarly to the conventional CAD, and the system C is configured by selecting the symbols registered in the library LB and arranging the same on a screen of the CAD 1.

The memory symbols SM correspond to memories such as DRAM (dynamic RAM; any type such as EDO or SDO), SRAM (static RAM; any type such as single-port or multi-port), FRAM (flash memory; any type such as And, Nor or Di-Nor) etc.

An exemplary semiconductor element corresponding to the memory control circuit symbol SC is a cache memory. The remaining configurations are described later.

The logic circuit symbol L corresponds to user logic etc. for controlling a CPU and a system to meet with user specifications.

Figure 3:
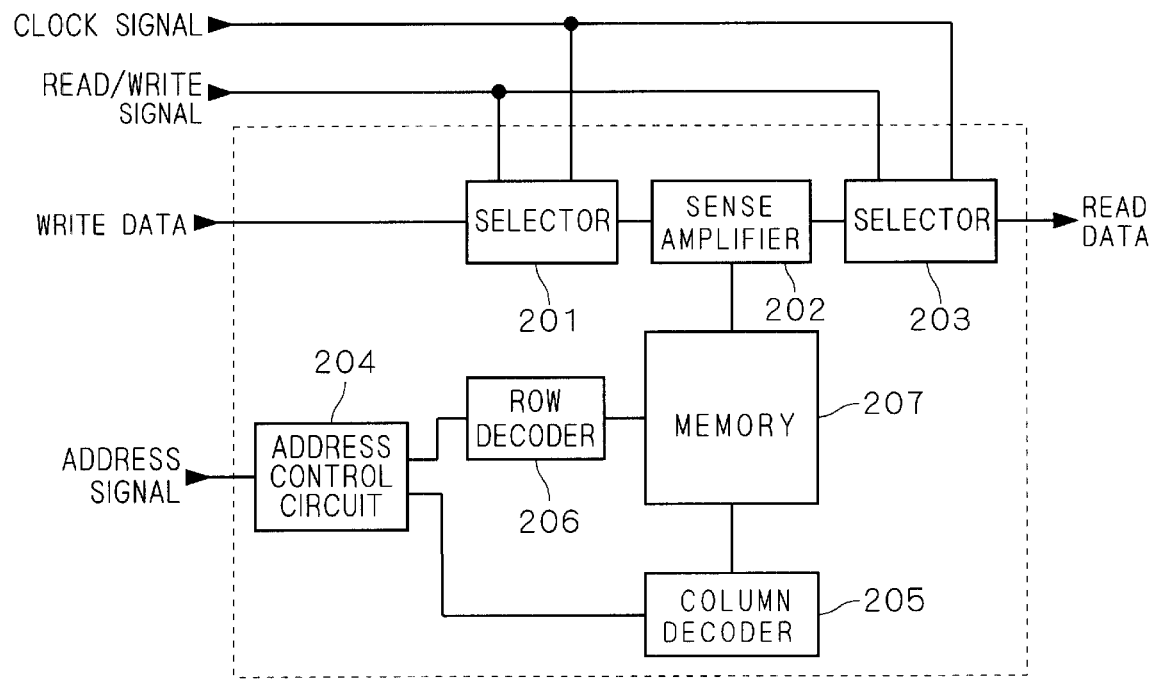
FIG. 3 is a block diagram of a memory symbol in the first embodiment of the present invention.

FIG. 3 shows the concept of the internal configuration of each memory symbol SM. The memory symbol SM includes a selector 201, a sense amplifier 202, a selector 203, an address control circuit 204, a column decoder 205, a row decoder 206 and a memory 207. A clock signal, a read/write signal, an address signal and write data shown in FIG. 3 are propagated from the memory control circuit symbol SC, while read data is supplied to the memory control circuit symbol SC. In operation, the address control circuit 204, the column decoder 205 and the row decoder 206 select a memory cell indicated by the address signal among memory cells (not shown) forming the memory 207. When the read/write signal indicates writing, the write data is written in the selected memory cell through the selector 201 and the sense amplifier 202 in response to the clock signal. When the read/write signal indicates reading, data of the selected memory cell is read through the sense amplifier 202 and the selector 203 as the read data in response to the clock signal.

Each of the aforementioned logic circuit symbol L and memory symbols SM is not restricted to one type but various types of such symbols are previously registered in the library LB.

The memory control circuit symbol SC is added for simplifying circuit design, and arranged to be interposed between the logic circuit symbol L and the memory symbols SM. The memory control circuit symbol SC is not restricted to one type but various types of such memory control circuit symbols corresponding to all conceivable combinations of the logic circuit symbol L and the memory symbols SM are previously registered in the library LB.

Figure 4:
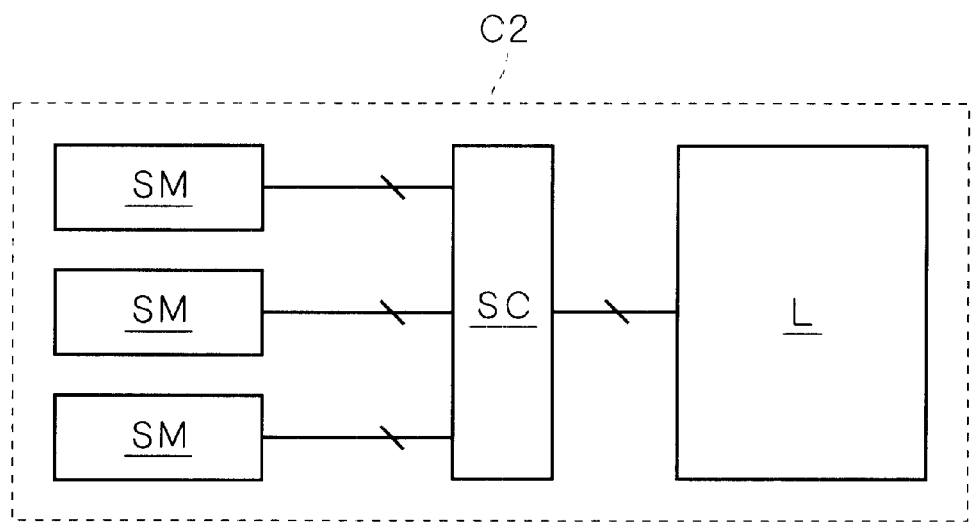
FIGS. 4 to 6 are block diagrams displayed on CAD according to the first embodiment of the present invention.

First, the configuration of the system C is input in the CAD 1 in order to obtain layout data integrating all components of the system C into a single chip regardless of external factors. FIG. 4 shows a configuration C2 input in the CAD 1. If the external factors are satisfied, it follows that layout data DI (FIG. 1) implemented on a single chip is generated from the configuration C2 as such.

Figure 5:
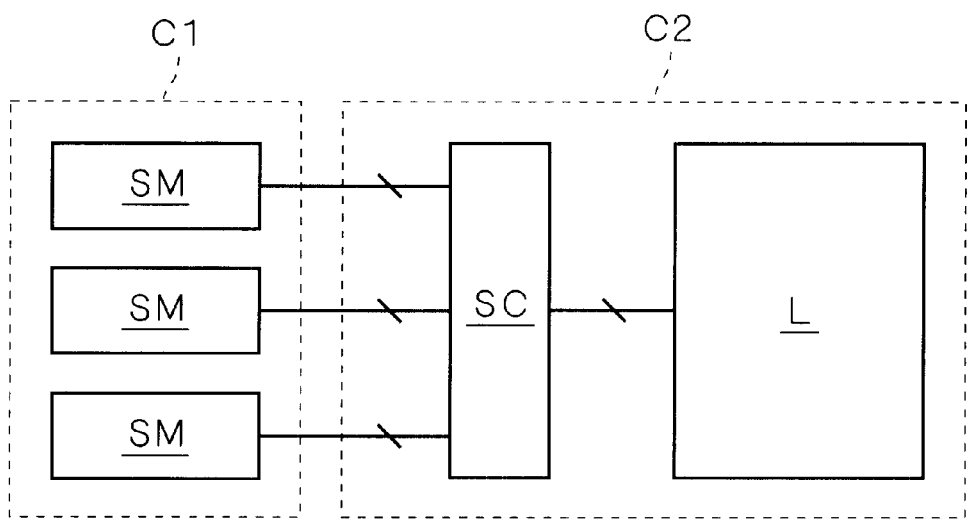
Figure 6:
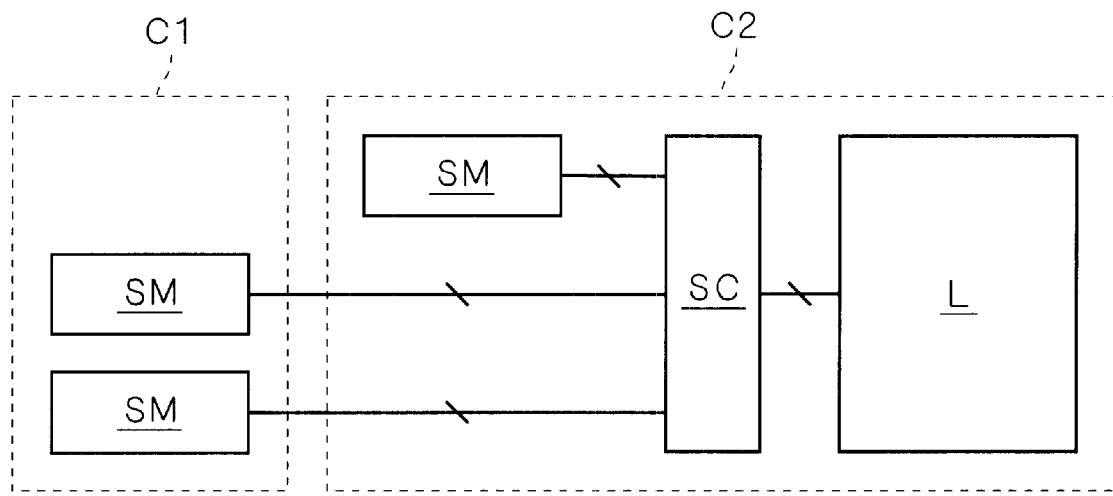

If the external factors are not satisfied, the memory symbols SM are fully moved from the configuration C2 and included in a configuration C1 for external circuits as shown in FIG. 5 or partially moved from the configuration C2 and included in the configuration C1 for the external circuits as shown in FIG. 6 in response to the external factors under a requirement for a multi-chip system, for example. According to the first embodiment, a designer operates the CAD 1 to perform the above editing. Layout data D2 and D3 are generated from the configurations C1 and C2 respectively.

Full Movement

Referring to FIG. 5, the configuration C1 consists of all memory symbols SM having been present in the configuration C2 shown in FIG. 4, and the configuration C2 consists of the memory control circuit symbol SC and the logic circuit symbol L. This division is employed when system requirements are low (with a small number of types of memories having a low-speed response time, for example) and the total area of the memory symbols SM, the memory control circuit symbol SC and the logic circuit symbol L exceeds the area of a single chip, for example. Since the total area of the symbols exceeds the area of the single chip, the memory symbols SM are arranged outside the configuration C2. When the memory symbols SM are arranged outside the configuration C2, it follows that the memories are formed on a different chip and hence the access speed to the memories is reduced. In this case, however, consider that the low system requirements are satisfied even if all memory symbols SM are arranged outside the configuration C2. Since all memory symbols SM are arranged outside the configuration C2, the region where the configuration C2 is arranged has a sufficient space so that the logic circuit symbol L and the memory control circuit symbol SC can be formed in a single chip.

The aforementioned division is employed when the cost performance is inferior despite the presence of a region capable of integrating the memory symbols SM, the memory control circuit symbol SC and the logic circuit symbol L into a single chip or when semiconductor elements corresponding to the memory symbols SM, the memory control circuit symbol SC and the logic circuit symbol L cannot be manufactured through the same process for integration into a single chip due to different manufacturing methods, in addition to the case where the memories have a low-speed response time. In the configuration C2, the memory control circuit symbol SC is arranged with the logic circuit symbol L thereby improving the access speed from the configuration C2 to the memory symbols SM in the configuration C1. The above is the description of full movement.

Partial Movement

Referring to FIG. 6, the configuration C1 consists of partial memory symbols SM having been present in the configuration C2 shown in FIG. 4, and the configuration C2 consists of the remaining memory symbol SM, the memory control circuit symbol SC and the logic circuit symbol L. This division is employed when system requirements are high (with a number of types of memories having an intermediate response time, for example) and the total area of the memory symbols SM, the memory control circuit symbol SC and the logic circuit symbol L exceeds the area of a single chip, for example. Since the total area of the symbols exceeds the area of the single chip, the memory symbols SM are partially arranged outside the configuration C2. If all memory symbols SM are formed outside the configuration C2, the access speed to the memories is remarkably reduced. Therefore, the memory symbols SM are partially arranged outside the configuration C2 to a degree satisfying the system requirements. Since the memory symbols SM are arranged outside the configuration C2, the region where the configuration C2 is arranged has a space so that the remaining memory symbol SM, the logic circuit symbol L and the memory control circuit symbol SC can be formed in a single chip. The memory control circuit symbol SC has a function of equalizing the access speed from the memory symbols SM of the configuration C1 to the logic circuit symbol L with that from the memory symbol SM of the configuration C2 to the logic circuit symbol L. Thus, all memory symbols SM have the same access speed as viewed from the logic circuit symbol L. The above is the description of partial movement.

Maintenance of the Status Quo

Referring to FIG. 4, the configuration C2 consists of all memory symbols SM, the memory control circuit symbol SC and the logic circuit symbol L. This division is employed when system requirements are high (with a number of types of memories having a high-speed response time, for example) and the total area of the memory symbols SM, the memory control circuit symbol SC and the logic circuit symbol L is within the area of a single chip. In this case, design-manufacturing is most simplified. The above is the description of maintenance of the status quo.

Figure 7:
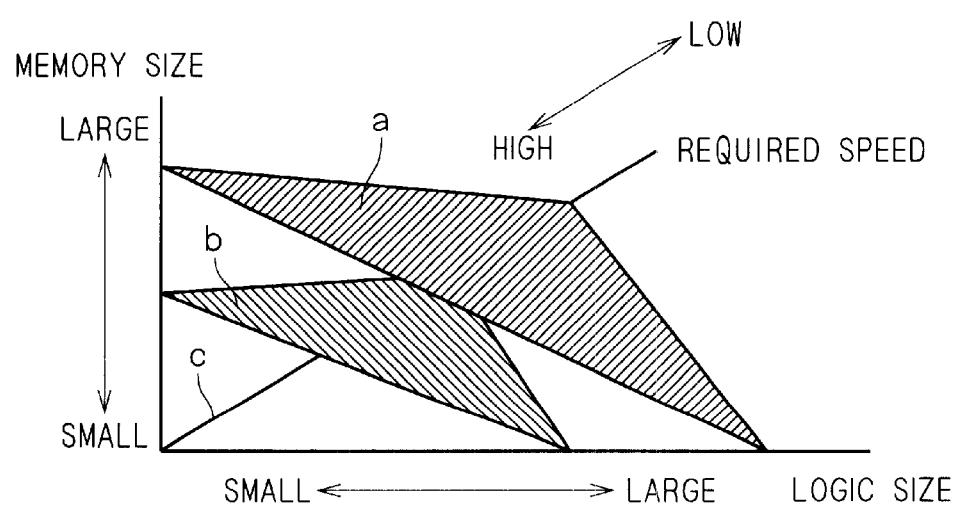
FIG. 7 is a graph showing the relation between the block diagrams displayed on the CAD according to the first embodiment of the present invention and the memory size etc.

Selection of full movement, partial movement or maintenance of the status quo is decided from the relation between the layout area (memory size) of the memory symbols SM drawn on the CAD 1, the layout area (logic size) of the logic circuit symbol L drawn on the CAD 1 and the required access speed (required speed), for example. FIG. 7 shows the relation between full movement a, partial movement b, maintenance of the status quo c, the memory size, the logic size and the required speed. As shown in FIG. 7, full movement a, partial movement b or maintenance of the status quo c is decided in this order as the memory size as well as the logic size are reduced and the required speed is increased. A graph such as that shown in FIG. 7 is previously registered in the CAD 1 so that the designer can invoke the graph at need. The designer may select the optimum ones from all types of memory symbols SM and logic circuit symbols L registered in the library LB and one of the aforementioned three modes (full movement, partial movement and maintenance of the status quo) in response to specifications required to the system on the basis of FIG. 7 for selecting the memory control circuit symbol SC optimum for the selected memory symbols SM and logic circuit symbol L as well as the selected mode.

Figure 8:
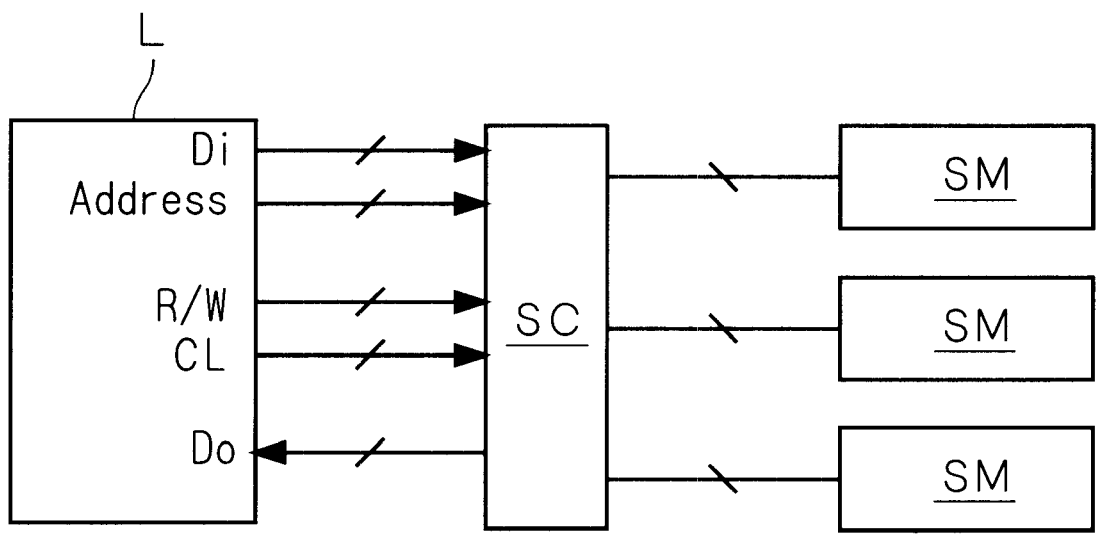
FIG. 8 is a block diagram showing connection between a memory control circuit symbol and the circumscription thereof.

The internal configuration of the memory control circuit symbol SC is now described. As shown in FIG. 8, the memory control circuit symbol SC receives write data Di, an address signal Address, a read/write signal R/W and a clock signal CL from the logic circuit symbol L and supplies read data Do to the logic circuit symbol L. The write data Di, the read data Do and the address signal Address indicate data to be written in any memory symbol SM, data read from the memory symbol SM and the address of the memory symbol SM for data reading/writing, and the read/write signal R/W indicates data reading or writing.

Figure 9:
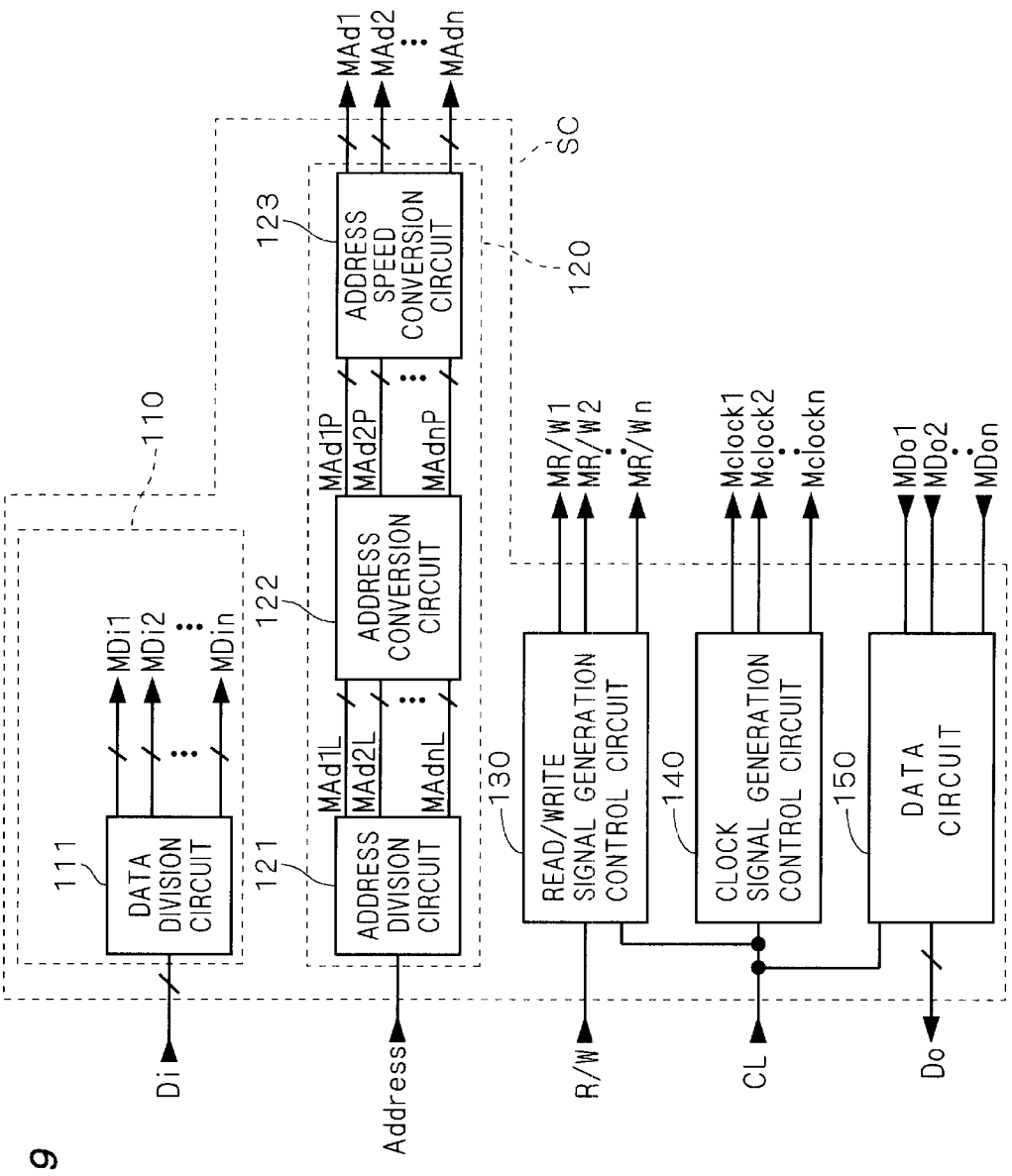
FIG. 9 is a block diagram showing the memory control circuit symbol in the first embodiment of the present invention.

FIG. 9 shows the internal configuration of the memory control circuit symbol SC. As shown in FIG. 9, the memory control circuit symbol SC includes a data circuit symbol 110, an address circuit symbol 120, a read/write signal generation control circuit symbol 130, a clock signal generation control circuit symbol 140 and a data circuit symbol 150. For the purpose of simplification, the symbols of the circuits are expressed also as the corresponding circuits.

Figure 10:
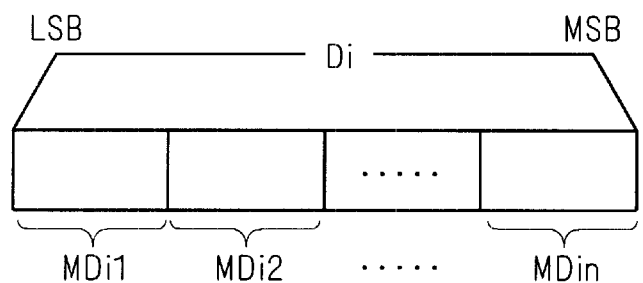
FIG. 10 is an operation explanatory diagram of a data division circuit in the first embodiment of the present invention.

The data circuit 110 includes a data division circuit 111. The data division circuit 111 is mainly formed by a buffer circuit, for capturing the write data Di at the timing of an edge of the clock signal CL and generating write data MDi1, MDi2, . . . , MDin from the write data Di. The write data MDi1, MDi2, . . . , MDin are supplied to the first, second, . . . , n-th memory symbols SM respectively. For example, the data division circuit 111 separates a bit string forming the write data Di into prescribed bits and outputs the same as the write data MDi1, MDi2, . . . , MDin, as shown in FIG. 10.

Figure 11:
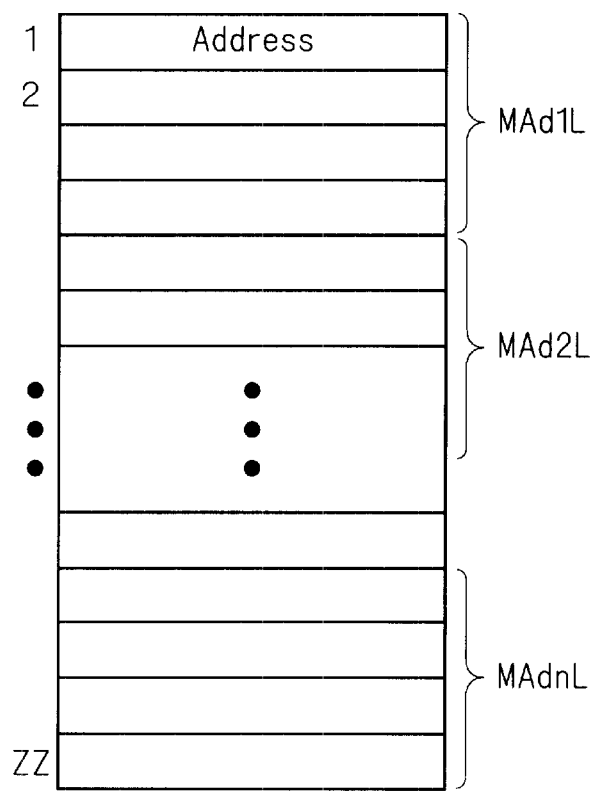
FIG. 11 is an operation explanatory diagram of an address division circuit in the first embodiment of the present invention.

The address circuit 120 includes an address division circuit 121, an address conversion circuit 122 and an address speed conversion circuit 123. The address division circuit 121 generates divided address signals MAd1L, MAd2L, . . . , MAdnL from the address signal Address, as shown in FIG. 11. These indicate the logic addresses of the first, second, . . . , n-th memory symbols SM respectively.

The address conversion circuit 122 converts the divided address signals MAd1L, MAd2L, . . . , MAdnL to divided write address signals MAd1P, MAd2P, . . . , MAdnP respectively. These indicate the physical addresses of the first, second, . . . , n-th memory symbols SM respectively.

The address speed conversion circuit 123 delays the divided address signals MAd1P, MAd2P, . . . , MAdnP so that change timings thereof match with each other. For example, the address speed conversion circuit 123 delays the remaining physical address signals so that a timing T1 matches with a finally changing one among the plurality of divided address signals, as shown in FIG. 12. If necessary, the designer finely controls internal circuits of the address speed conversion circuit 123 with the CAD 1 for matching the timing T1.

The read/write signal generation control circuit 130 is mainly formed by a latch circuit and a buffer circuit, for generating read/write signals MR/W1, MR/W2, . . . , MR/Wn from the read/write signal R/W and outputs the same at the timing of the clock signal CL. The read/write signals MR/W1, MR/W2, . . . , MR/Wn are supplied to the first, second, . . . , n-th memory symbols SM respectively. The read/write signal generation control circuit 130 converts the read/write signals to match with the input system (multi-port, single-port, SRAM or DRAM, for example) corresponding to the type of the memory symbols SM or finely controls the timing for supplying the read/write signals to the memory symbols SM at a timing obtained by dividing or multiplying the clock signal CL. If necessary, the designer finely controls the internal circuits of the read/write signal generation control circuit 130 with the CAD 1.

The clock signal generation control circuit 140 is mainly formed by a latch circuit and a buffer circuit, for generating clock signals Mclock1, Mclock2, . . . , Mclockn from the clock signal CL. The clock signals Mclock1, Mclock2, . . . , Mclockn are supplied to the first, second, . . . , n-th memory symbols SM respectively. The clock signal generation control circuit 140 generates the clock signals supplied to the memory symbols SM in consideration of the input system (multi-port, single-port, SRAM or DRAM, for example) corresponding to the type of the memory symbols SM and the characteristics (the processing speed, for example) of the memory symbols SM. For example, the clock signal generation control circuit 140 generates the clock signals suitable for the memory symbols SM by dividing or multiplying the clock signal CL. If necessary, the designer finely controls the internal circuits of the clock signal generation control circuit 140 with the CAD 1.

The data circuit 150 is mainly formed by a latch circuit and a buffer circuit, for capturing write data MDo1, MDo2, ..., MDon read from the memory symbols SM at the timing of the edge of the clock signal CL and outputs the same in parallel as the read data Do.

As hereinabove described, a delay time set circuit including the address circuit 120, the read/write signal generation control circuit 130 and the clock signal generation control circuit 140 sets a delay time for the control signal (the address signal, the read/write signal or the clock signal) propagated from the logic circuit symbol L to each of a plurality of types (whether the memory symbols SM are DRAMs, SRAMs or flash memories and whether the same are external memories (i.e., formed in the configuration C1) or internal memories (i.e., formed in the configuration C2), for example) of memory symbols SM.

Figure 13:
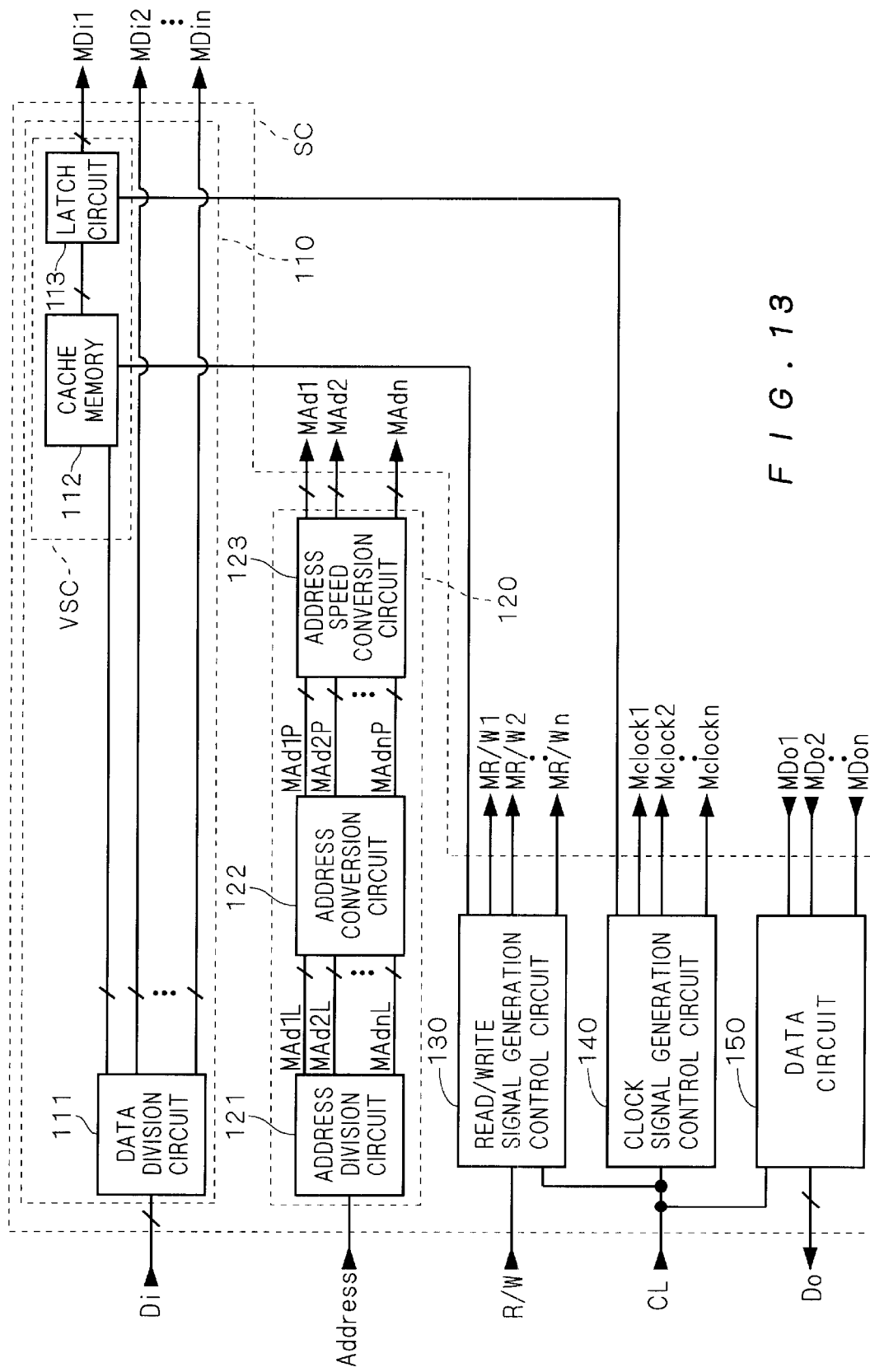
FIG. 13 is a block diagram of the memory control circuit symbol in the first embodiment of the present invention.

The memory control circuit symbol SC previously registered in the CAD 1 may further include a storage circuit VSC (variable size cache) as shown in FIG. 13. The storage circuit VSC includes a cache memory 112 and a latch circuit 113. The cache memory 112 captures and outputs data for the first memory symbol SM, for example, in accordance with the read/write signal generated by the read/write signal generation control circuit 130. The latch circuit 113 captures the data output from the cache memory 112 at the timing of the clock signal generated by the clock signal generation control circuit 140 and outputs the same as the write data MDi1. The access speed can be improved by providing the storage circuit VSC.

Whether or not to provide the storage circuit VSC or in correspondence to which memory symbol SM to provide the storage circuit VSC is decided from the relation between the bit number (bit width) of the write data Di and the required access speed (required speed). FIG. 14 shows the relation between the bit width of the write data Di, the required speed and presence/absence of the storage circuit VSC. As shown in FIG. 14, the access speed may not be improved as the bit width as well as the required speed are reduced and hence the storage circuit VSC is not required. A graph such as that shown in FIG. 14 is previously registered in the CAD 1 so that the designer can invoke the graph at need. The designer may select the optimum one from all types of memory control circuit symbols SC registered in the library LB on the basis of this graph.

Figure 15:
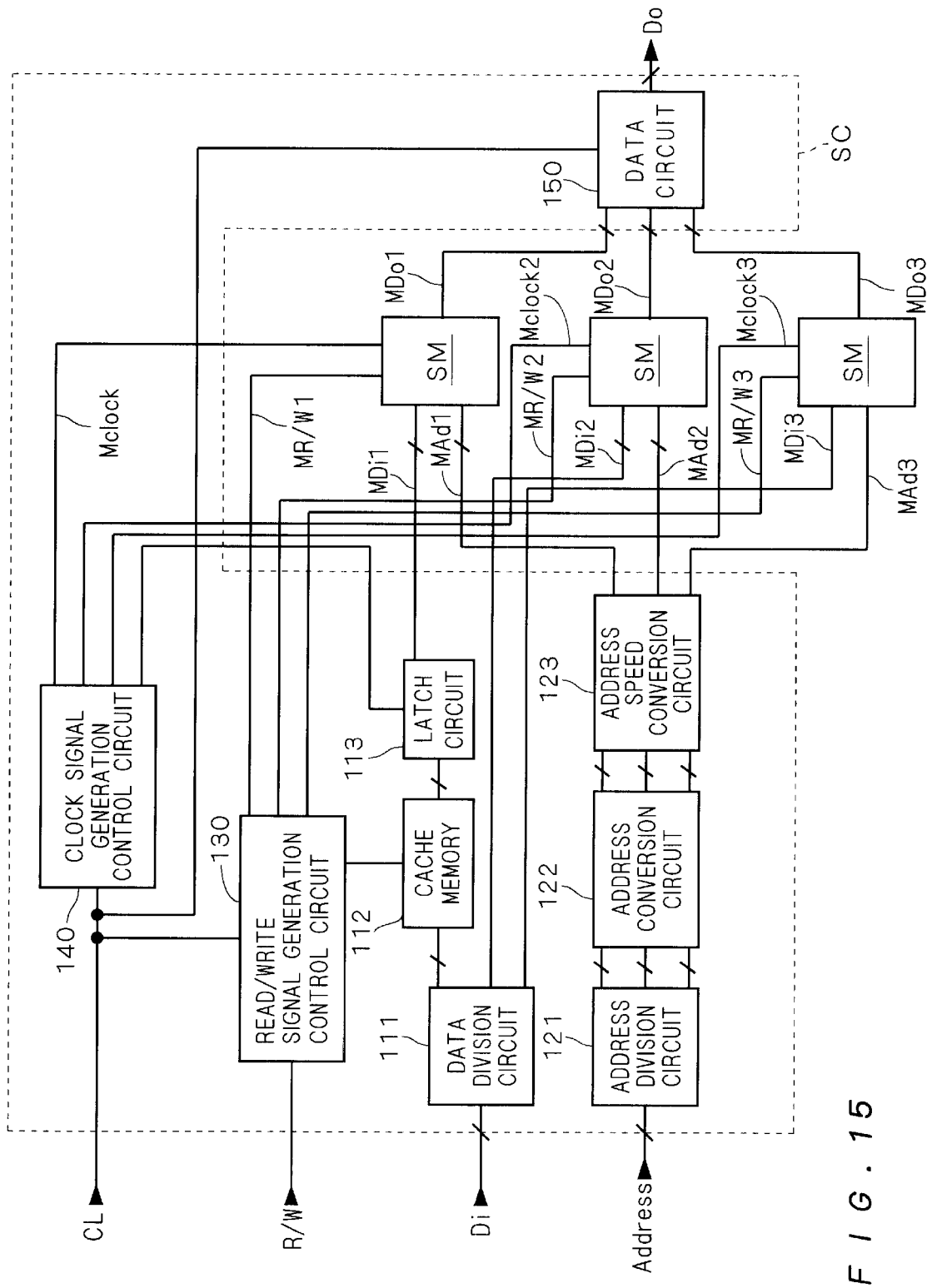
FIG. 15 is a block diagram showing an exemplary combination of the memory symbols and the memory control circuit symbol in the first embodiment of the present invention.

For example, FIG. 15 shows three memory symbols SM and one memory control circuit symbol SM in the case of the configuration C2 shown in FIG. 4.

As hereinabove described, the circuits can be readily designed so that the access speeds of the plurality of memory symbols SM as viewed from the logic circuit symbol L can be equally handled by providing the memory control circuit symbol SC between the memory symbols SM and the logic circuit symbol L, for reducing the burden imposed on the designer.

Second Embodiment

Figure 16:
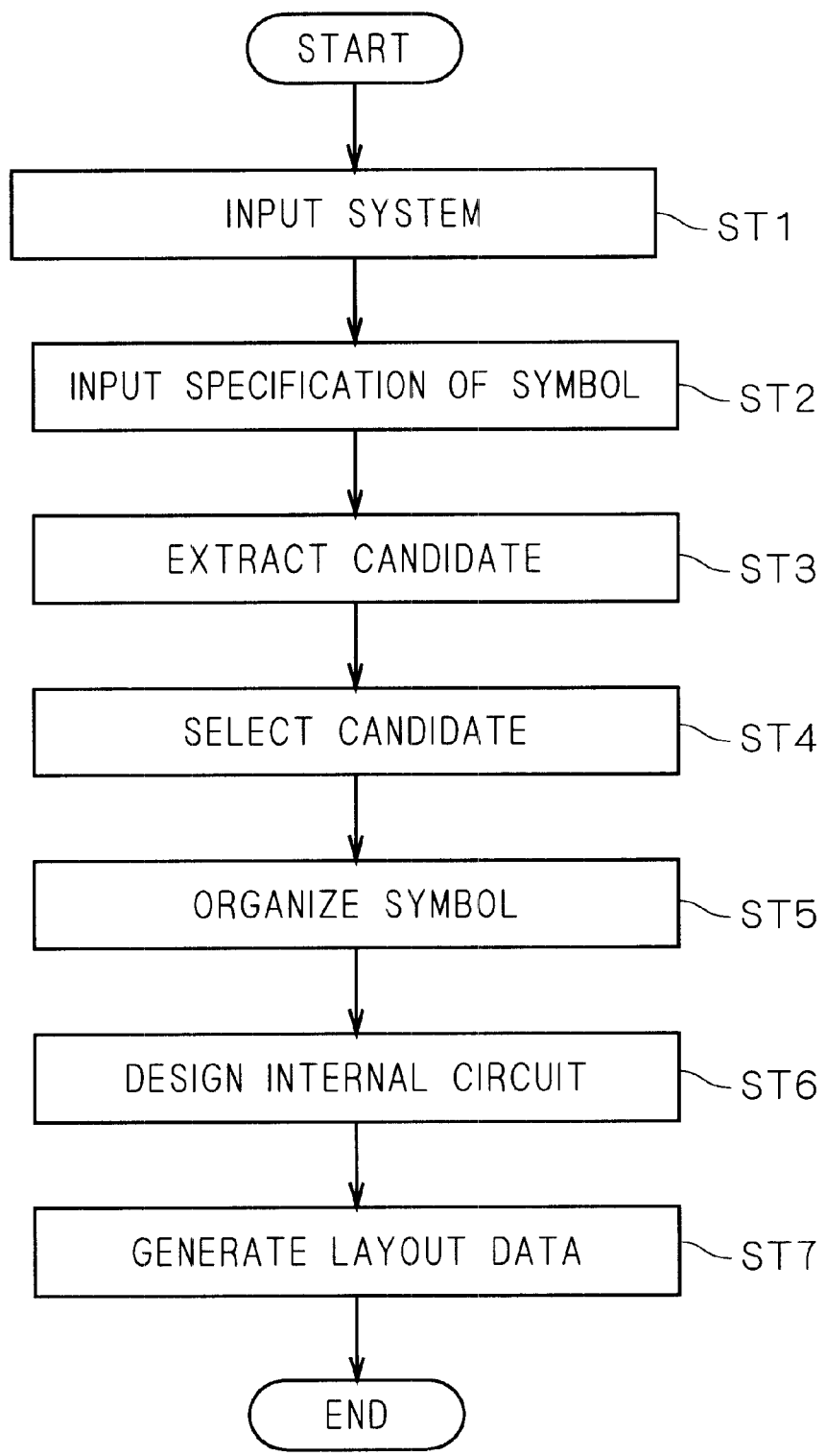
FIG. 16 is a flow chart showing a method of designing the semiconductor device according to the first embodiment of the present invention.
Figure 17:
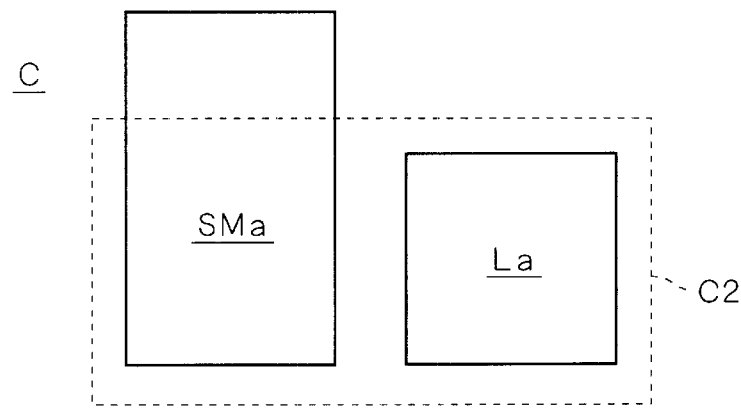
FIG. 17 is a block diagram showing an exemplary object of design according to a second embodiment of the present invention.

Another way of employing the CAD 1 is now described with reference to FIG. 16. First, a circuit C shown in FIG. 17, for example, is input in the CAD 1 (step ST1). Symbols SMa and La are the so-called black boxes, the internal configurations of which are not decided.

Then, specification data of the symbol SMa are input in the CAD 1. The specification data include the type (DRAM, SRAM, flash memory or the like) included in the symbol SMa, the magnitude (storage capacity) of the symbol SMa and the characteristics (the bit width, the processing speed etc., for example) of the symbol SMa. Then, specification data of the symbol La are input in the CAD 1. The specification data include the candidate for an applicable manufacturing process name (applicable process range), the scale (names of a CPU and other logic circuits included in the symbol La, for example) of the symbol La, the characteristics (the power supply voltage, the processing speed etc., for example) of the symbol La, the allowable range of power consumption etc., for example (step ST2).

System configuration data (the symbols La and SMa and the specification data thereof) are input in the CAD 1 through the aforementioned steps ST1 and ST2, for displaying the system configuration data as an image.

Then, the CAD 1 extracts a configuration includable in the configuration C2 from the data input in the steps ST1 and ST2.

Figure 18:
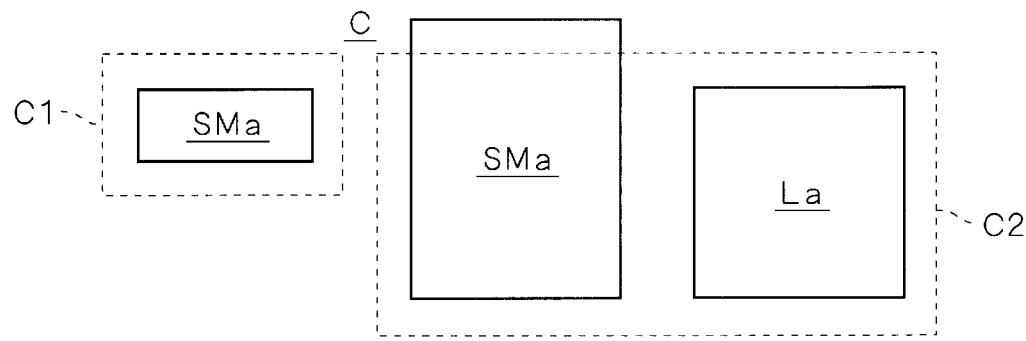
FIG. 18 is an operation explanatory diagram of CAD according to the second embodiment of the present invention.

In this procedure, at least the following operations are performed: If the symbol SMa includes a memory of a type not manufacturable in the aforementioned applicable process range (single-chip condition), this memory is taken out from the configuration C2 (FIG. 18).

Then, a memory forced out from the layout area (single-chip condition) of the configuration C2 when the symbol SMa is arranged with the symbol La is taken out from the configuration C2. This memory is decided as follows, for example: For example, a memory having a low processing speed is left in the configuration C2 while that having a high processing speed is taken out from the configuration C2 (candidate 1 in FIG. 19).

Alternatively, a memory having a power supply voltage different from that for the symbol La is taken out from the configuration C2 (candidate 2 in FIG. 20).

Figure 19:
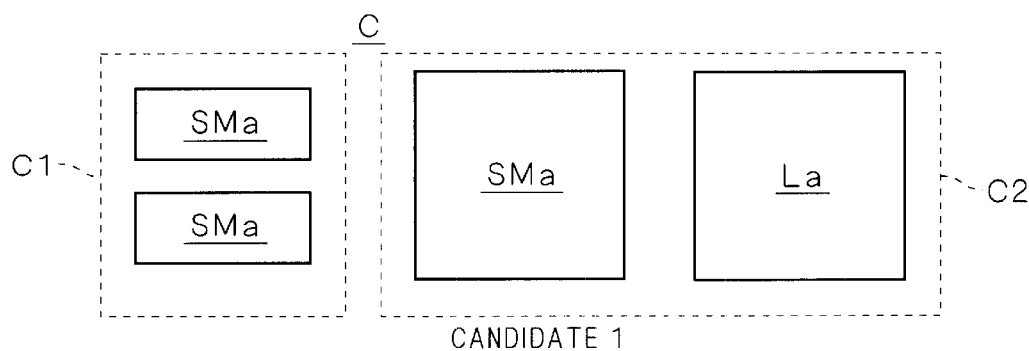

The CAD 1 extracts data satisfying the single-chip condition from the system configuration data in the aforementioned manner, makes a display for rendering an image corresponding to the data satisfying the single-chip condition conspicuous (by displaying the symbols in the configuration C2 and those in the configuration C1 in different colors, for example) and lists a plurality of candidates as shown in FIGS. 19 and 20 (step ST3). Thus, the designer may not determine which one of the system configuration data input in the CAD 1 is to be included in the configuration C2, and the burden imposed on the designer is reduced.

Further, the CAD 1 takes out the memory having a power supply voltage different from that for the symbol La from the configuration C2, whereby the design is simplified.

A general cost corresponding to each candidate is registered in the CAD 1, which in turn calculates the cost for each candidate from the registered content. The cost is determined from the chip size of the configuration C2, the yield thereof and the aforementioned power consumption. The designer selects any of the candidates listed by the CAD 1 with reference to the cost. Alternatively, the CAD 1 may select the candidate at the lowest cost (step ST4).

When the candidate is selected, the CAD 1 selects the optimum one among all types of memory control circuit symbols SC in the library LB from the selected candidate. For example, the CAD 1 may have a table indicating the optimum association between the symbols SMa and La and the memory control circuit symbols SC for selecting the optimum memory control circuit symbol SC with reference to the table. Alternatively, the CAD 1 may refer to FIGS. 7 and 14 for selecting the optimum memory control circuit symbol SC. As shown in FIG. 21, the CAD 1 adds the memory control circuit symbol SC and input/output circuits IO into the configuration C2 of the selected candidate and connects the symbol La and the memory control circuit symbol SC as well as the memory control circuit symbol SC, the symbols SMa and the input/output circuits IO. The CAD 1 adds two input/output circuits IO into the configuration C1 of the selected candidate and connects the symbols SMa and the input/output circuits IO (step ST5). If any symbol SMa remaining in the configuration C2 includes a memory of a different type (flash memory, DRAM, SRAM or the like, for example), the CAD 1 divides this symbol SMa into a plurality of parts to correspond to the type.

Figure 22:
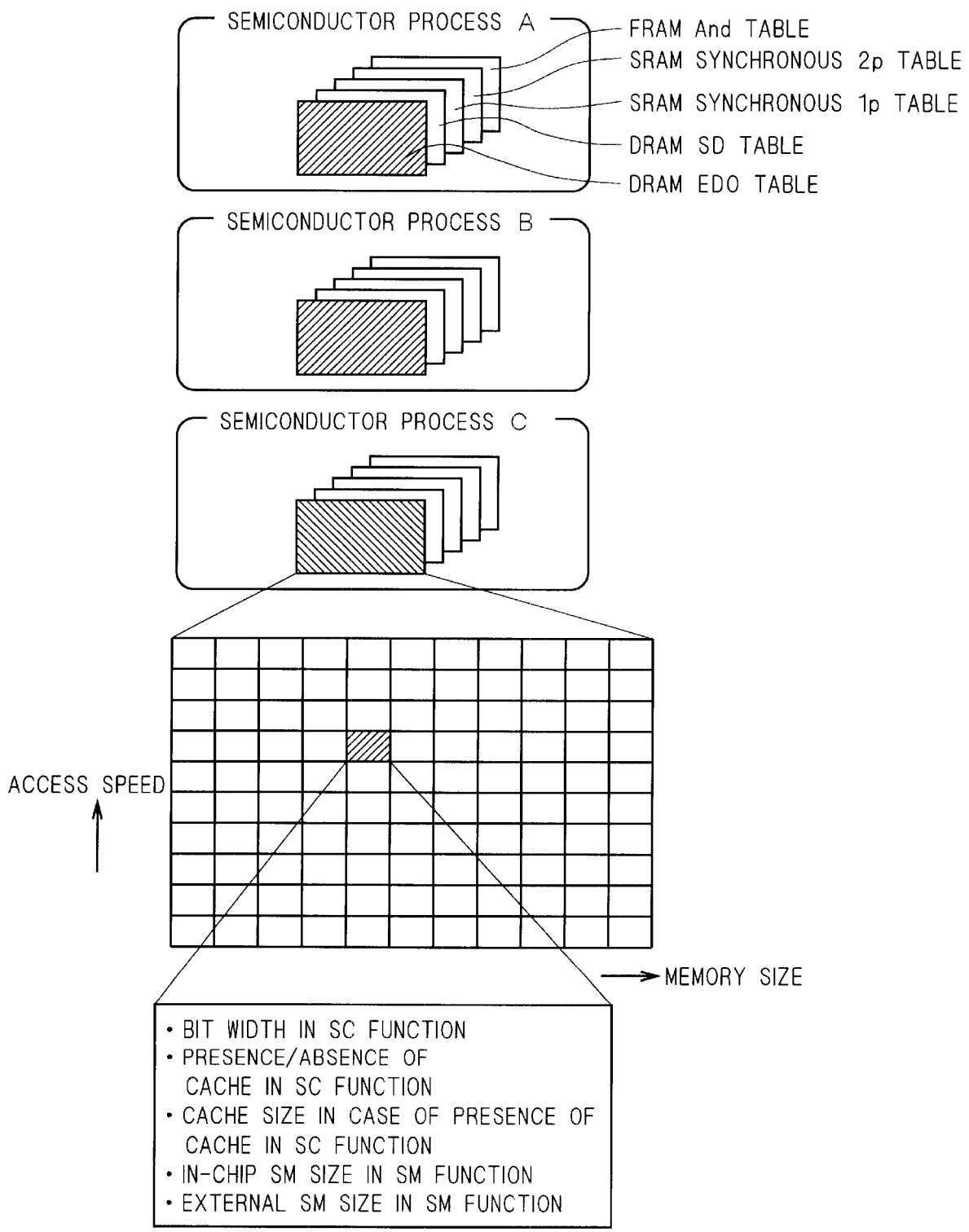
FIG. 22 illustrates the association between specification data and symbols in the second embodiment of the present invention.

Then, the designer internally designs the symbol La, the memory control circuit symbol SC and the symbols SMa. For example, the designer selects the optimum memory symbols SM and the optimum logic circuit symbol L corresponding to the symbols SMa and La from the library LB and substitutes the former for the latter. Alternatively, the CAD 1 may have a table indicating the optimum association between the specification data of the symbols SMa and La and the memory symbols SM and the logic circuit symbol L as shown in FIG. 22, for example, for selecting the optimum memory symbols SM and the optimum logic circuit symbol L with reference to the table and substituting the same for the symbols SMa and La. If necessary, the designer finely controls the internal circuits of the memory symbols SM and the logic circuit symbol L with the CAD 1. Due to the provision of the memory control circuit symbol SC, the circuits can be readily designed to be capable of equally handling the access speed of the plurality of memory symbols SM as viewed from the logic circuit symbol L by employing the storage circuit VSC shown in the first embodiment, for example, and reducing the burden imposed on the designer (step ST6).

Thus, a circuit diagram of only the configuration C2 or the configurations C2 and C1 is completed. Then, the completed circuit diagram is converted to the layout data D1 or the layout data D2 and D3 (FIG. 1). In addition to the layout data, data (logic synthesis model, timing model, simulation model, function verification model (HDL) and P & R model) of necessary modes may also be generated (step ST7). On the basis of the aforementioned layout data, a, system LSI (semiconductor device 2) or a semiconductor device 3 formed by a board and a chip shown in FIG. 1 is completed.

Figure 23:
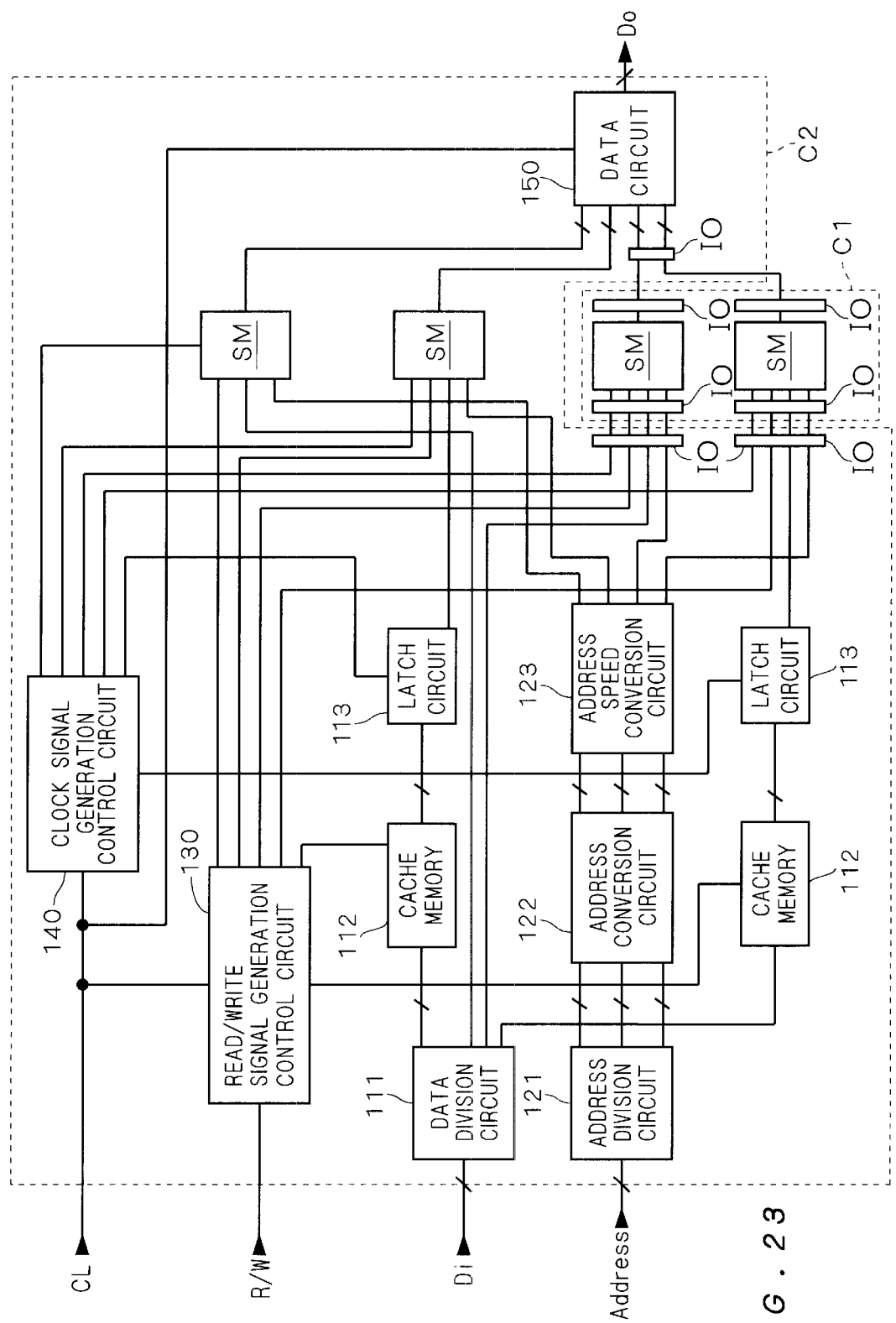
FIG. 23 is a block diagram showing an exemplary combination of external and internal circuits in the second embodiment of the present invention.

FIG. 23 shows a boundary between the configurations C1 and C2 in the case of the semiconductor device 3.

Figure 24:
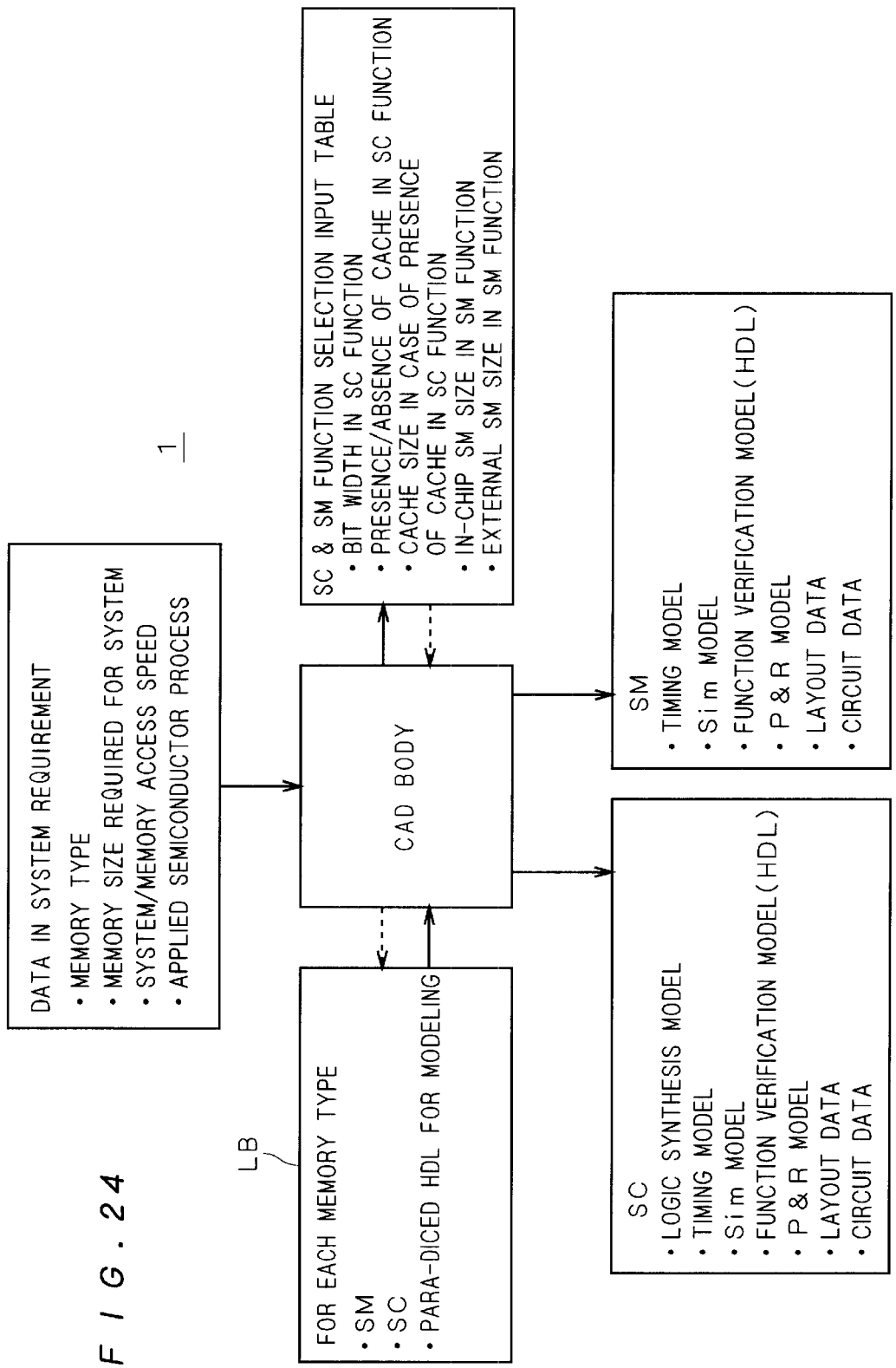
FIG. 24 is a conceptual diagram showing the CAD according to the second embodiment of the present invention.

FIG. 24 is a conceptual diagram of the aforementioned CAD 1.

Third Embodiment

Figure 27:
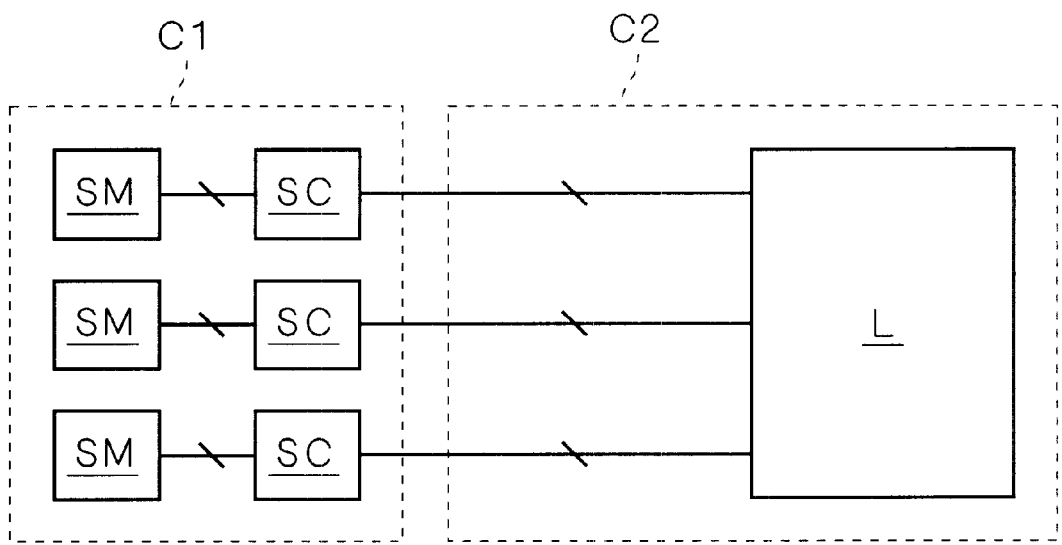

While the memory control circuit symbol SC is provided only in the configuration C2 in each of the first and second embodiments, such memory control circuit symbols SC may be provided to correspond to a plurality of memory symbols SM and included in the configuration C1. For example, the configurations shown in FIGS. 4, 5 and 6 may be changed to those shown in FIGS. 25, 26 and 27 respectively. Also in this case, design can be readily performed so that all memory symbols SM can be identically controlled (to have the same access speed, for example) as viewed from the logic circuit symbol L, and hence the burden imposed on the designer can be reduced. Further, the memory symbols SM and the memory control circuit symbols SC are in one-to-one correspondence to each other, whereby wires connecting the memory symbols SM and the memory control circuit symbols SC can be simplified, an efficient layout can be designed and speed increase as well as reduction of power consumption can be attained.

It follows that each of the semiconductor devices 2 and 3 obtained in the first to third embodiments comprises a logic circuit (circuit corresponding to the logic circuit symbol L), a plurality of types of memories (circuits corresponding to the memory symbols SM) and a memory control circuit (circuit corresponding to the memory control circuit symbol SC) interposed between the logic circuit and all of the plurality of types of memories for setting the response time of each of the plurality of types of memories as viewed from the logic circuit.

While the invention has been shown and described in detail, the foregoing description is in all aspects illustrative and not restrictive. It is therefore understood that numerous modifications and variations can be devised without departing from the scope of the invention.

What is claimed is:

1. A method of designing a semiconductor device comprising steps of:
    (a) inputting data related to the configuration of a system in CAD (computer aided design) employed for designing said system;
    (b) obtaining layout data integrating all components of said system into a single chip regardless of external factors; and
    (c) extracting data not formable on said single chip from said layout data by said CAD when external factors are present.

2. The method of designing a semiconductor device according to claim 1, wherein said system includes a memory and a logic circuit, and
    said step (c) includes a step of:
    (c-1) extracting a memory not compatible to design in a single chip with said logic circuit on the basis of data related to the configuration of said memory.

3. The method of designing a semiconductor device according to claim 2, wherein a memory having a higher processing speed than a memory arranged with said logic circuit is extracted in said step (c-1).

4. The method of designing a semiconductor device according to claim 3, arranging a memory control circuit for setting the response time of said memory as viewed from said logic circuit between said logic circuit and said memory.

5. The method of designing a semiconductor device according to claim 2, wherein a memory having a power supply voltage different from that for said logic circuit is extracted in said step (c-1).

6. The method of designing a semiconductor device according to claim 2, wherein said step (a) includes a step of:
    (a-1) displaying an image showing said data, and said step (c-1) includes a step of:
    (c-1-1) making a display for highlighting an image corresponding to data c satisfying said single-chip condition among said data of said memory in said image displayed through said step (a-1).

7. The method of designing a semiconductor device according to claim 2, wherein a plurality of types of data related to the configurations of said logic circuit and said memory are registered in said CAD.

* * * * *